United States Patent
Sutton et al.

(10) Patent No.: US 12,387,982 B2
(45) Date of Patent: Aug. 12, 2025

(54) ADAPTIVE FILL TECHNIQUES FOR AVOIDING ELECTROMIGRATION

(71) Applicant: International Business Machines Corporation, Armonk, NY (US)

(72) Inventors: Akil Khamisi Sutton, Poughkeepsie, NY (US); Peter A. Smith, Wappingers Falls, NY (US); John Greg Massey, Jericho, VT (US); William Edward Ansley, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 687 days.

(21) Appl. No.: 17/584,605

(22) Filed: Jan. 26, 2022

(65) Prior Publication Data

US 2023/0238280 A1    Jul. 27, 2023

(51) Int. Cl.
*H01L 21/768* (2006.01)
*H01L 23/528* (2006.01)

(52) U.S. Cl.
CPC ...... *H01L 21/76886* (2013.01); *H01L 23/528* (2013.01)

(58) Field of Classification Search
CPC ............. H01L 23/528; H01L 23/5283; H01L 23/5286; H01L 23/525; H01L 23/5382; H01L 23/5381; H01L 23/5386; H01L 23/5226; H01L 21/76877; H01L 21/76885; H01L 22/26
See application file for complete search history.

(56) References Cited

U.S. PATENT DOCUMENTS

| | | |
|---|---|---|
| 6,489,684 B1 * | 12/2002 | Chen ................... H01L 23/5283 257/E23.152 |
| 7,614,024 B2 | 11/2009 | Bothra |
| 7,694,258 B1 | 4/2010 | Ylinen et al. |
| 7,844,936 B2 | 11/2010 | Melzner |
| 8,627,245 B1 | 1/2014 | Banerjee et al. |
| 9,659,835 B1 | 5/2017 | Gambino et al. |
| 10,628,551 B2 | 4/2020 | Huda |
| 10,691,865 B2 | 6/2020 | Huda et al. |
| 2011/0173583 A1 | 7/2011 | Barwin et al. |
| 2015/0095873 A1 | 4/2015 | Lin et al. |
| 2019/0005180 A1 | 1/2019 | Yeh et al. |
| 2021/0042460 A1 | 2/2021 | Lin et al. |
| 2021/0217697 A1 | 7/2021 | Chava et al. |

OTHER PUBLICATIONS

International Search Report; Mailed: Apr. 28, 2023; Application No. PCT/CN2023/072399; Filed: Jan. 16, 2023; 7 pages.

* cited by examiner

*Primary Examiner* — Thanhha S Pham
(74) *Attorney, Agent, or Firm* — CANTOR COLBURN LLP; Randy Tejeda

(57) ABSTRACT

Embodiments are for using adaptive fill techniques to avoid electromigration, thereby resulting in electromigration signoff. A wire segment failing to meet an electromigration current limit is determined on an integrated circuit (IC). Fill shapes are connected adjacent to the wire segment to cause the wire segment to meet the electromigration current limit. The fill shapes are non-functional shapes on the IC.

16 Claims, 13 Drawing Sheets

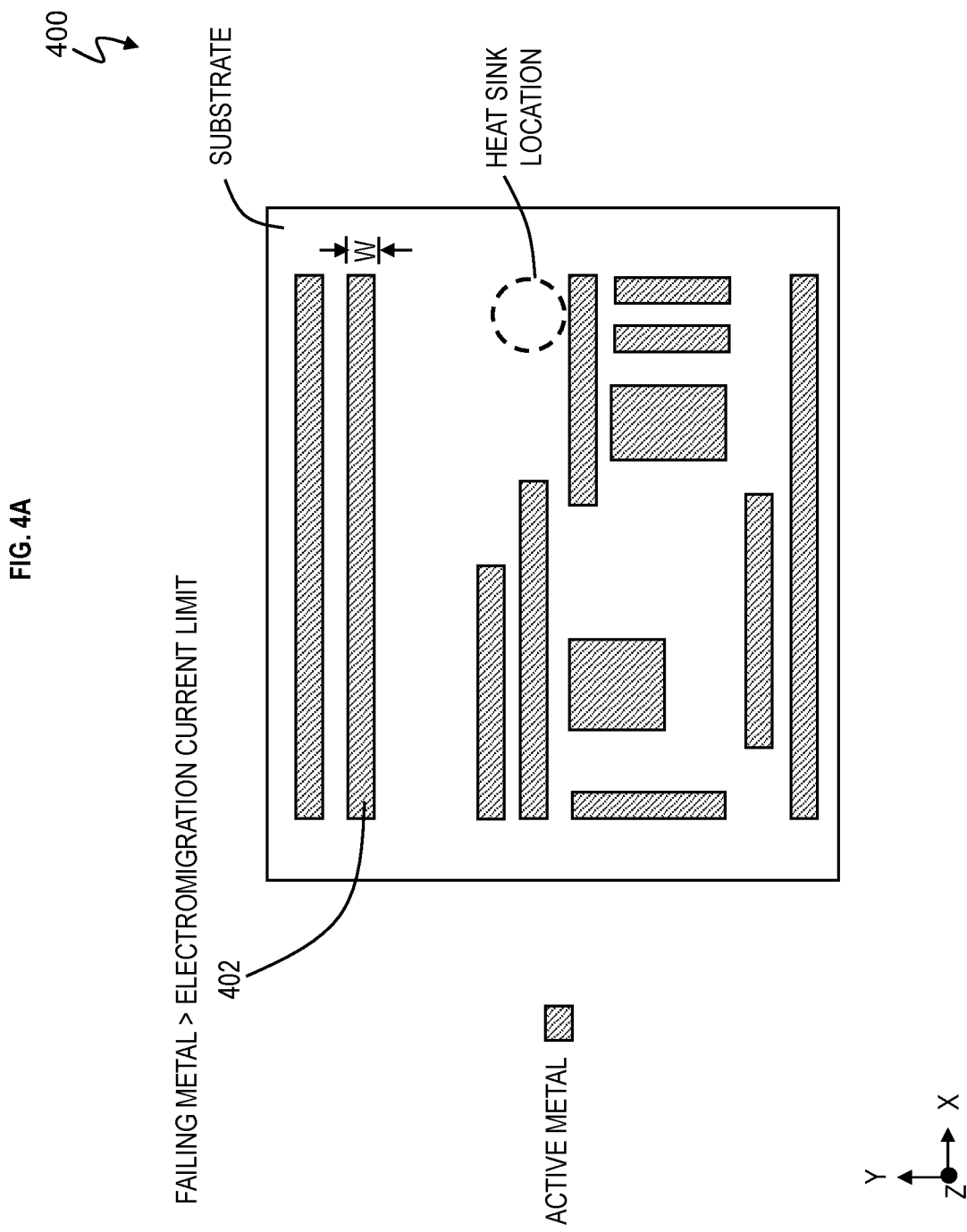

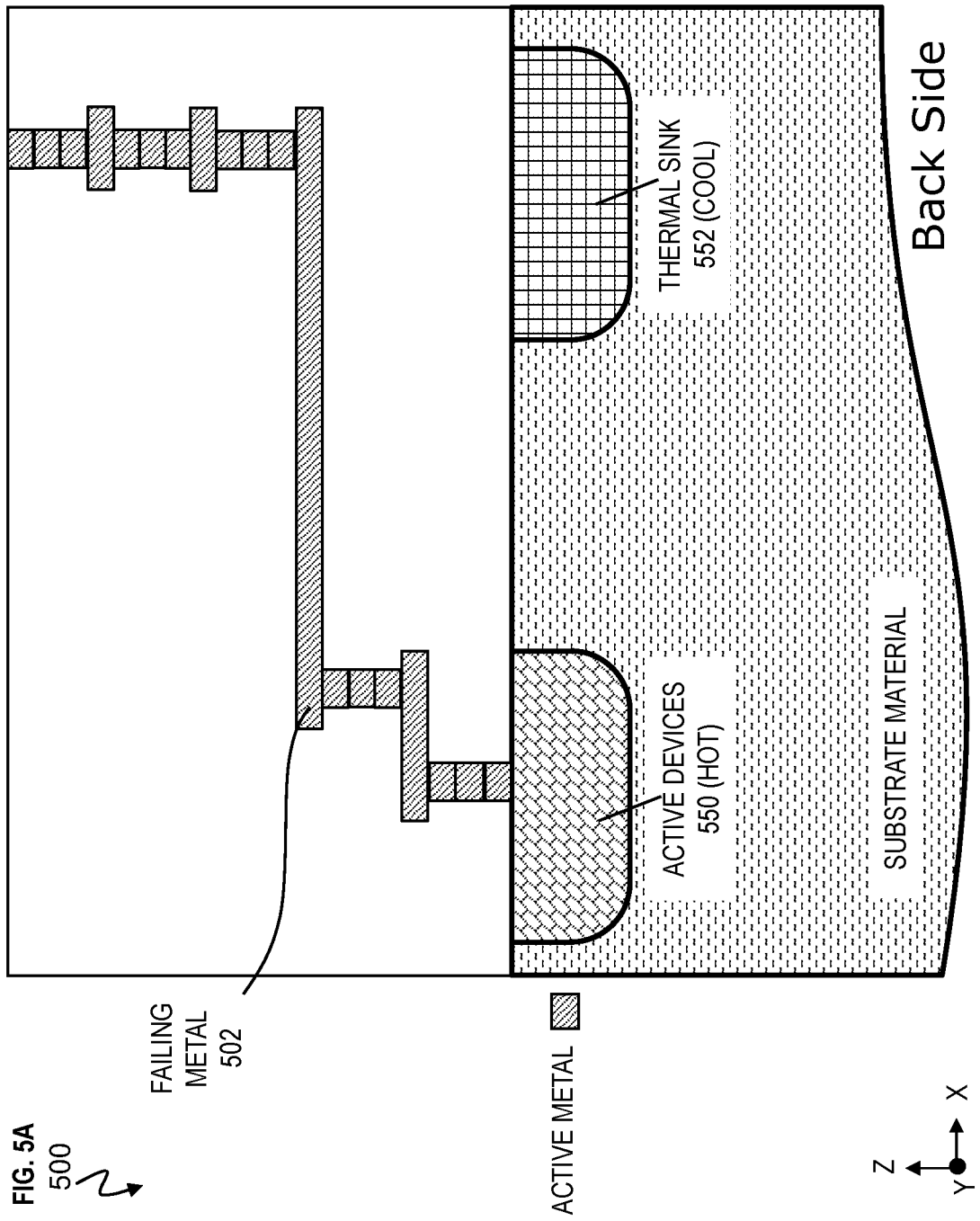

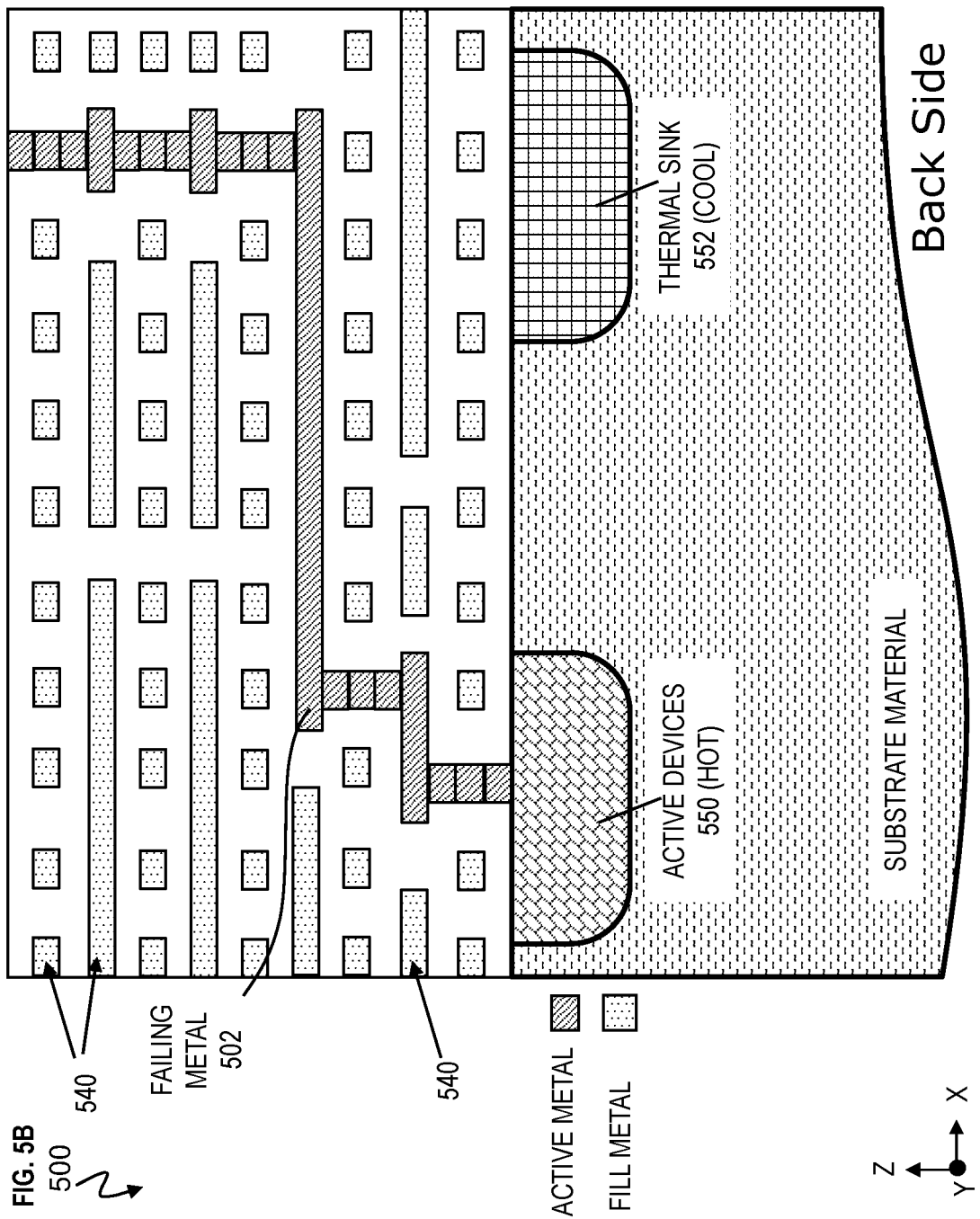

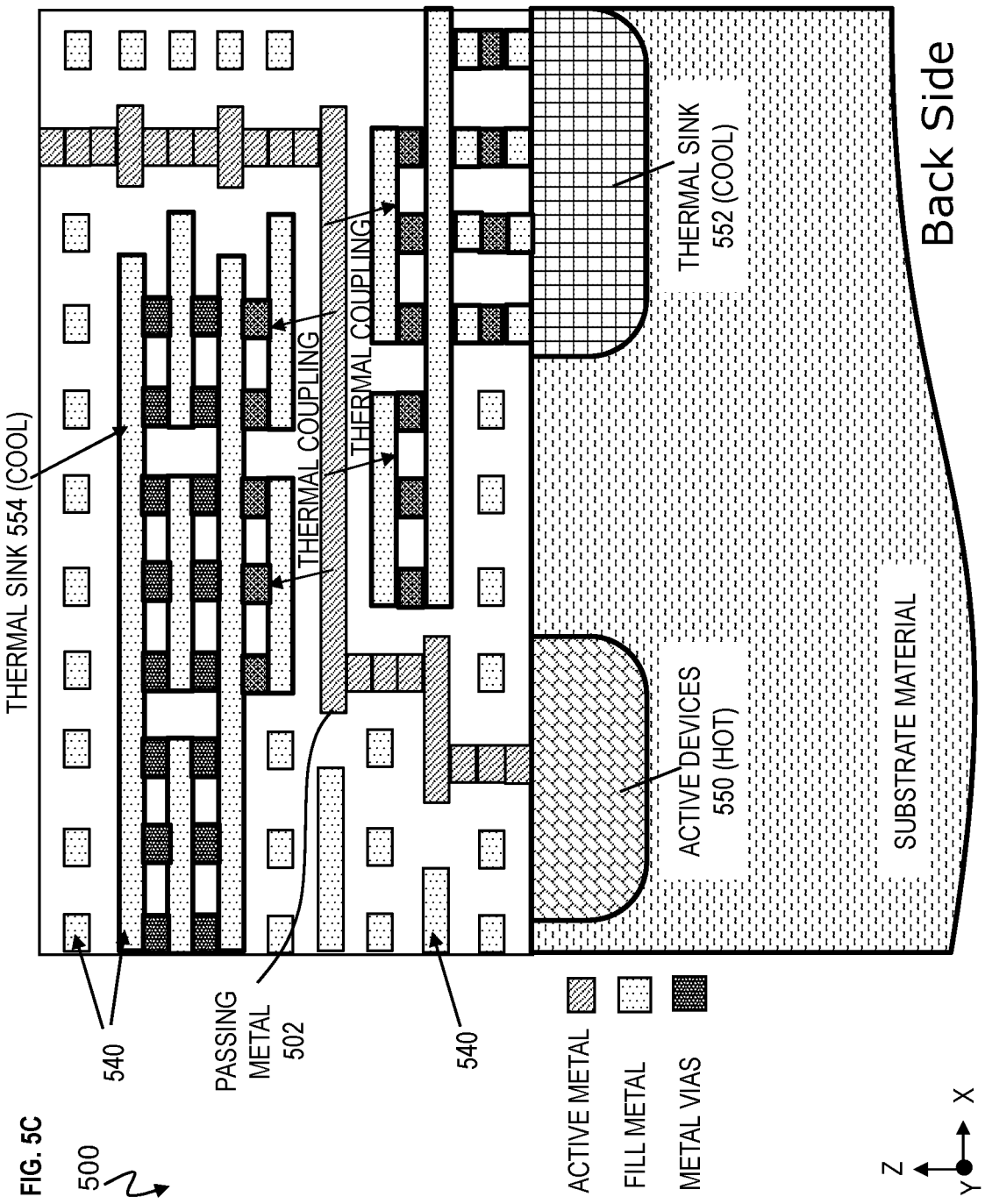

FIG. 6 600

DETERMINE A WIRE SEGMENT FAILING TO MEET AN ELECTROMIGRATION CURRENT LIMIT ON AN INTEGRATED CIRCUIT (IC) 602

CONNECT FILL SHAPES ADJACENT TO THE WIRE SEGMENT TO CAUSE THE WIRE SEGMENT TO MEET THE ELECTROMIGRATION CURRENT LIMIT, THE FILL SHAPES BEING NON-FUNCTIONAL SHAPES ON THE IC 604

ADAPTIVE FILL TECHNIQUES FOR AVOIDING ELECTROMIGRATION

BACKGROUND

The present invention generally relates to fabrication methods and resulting structures for integrated circuits, and more specifically, to fabrication methods and resulting structures configured and arranged for using adaptive fill techniques to avoid electromigration.

Switching transistors in an active portion of an integrated circuit (IC) and the active wires that carry the electrical current to and from transistors in the active portion generate a significant amount of heat. The generated heat affects one or more portions of the IC and specifically results in a reduction of the robustness of wires to the electromigration (EM) phenomena. From a reliability perspective, EM is evidenced by the movement of atoms based on the flow of current through a material. If the current density is high enough, the heat dissipated within the material (e.g., active wires) will repeatedly break atoms from the structure and move them. This will create both "vacancies" and "deposits". The vacancies can grow and eventually break circuit connections in the active wires resulting in open circuits. Conversely, excessive deposits can facilitate the shorting of paths between neighboring wires. The currents at which these phenomena occur, known as EM limits, are strongly correlated to the wire temperature, geometry, circuit ambient, and circuit use conditions.

SUMMARY

Embodiments of the present invention are directed to methods for using adaptive fill techniques to reduce the temperature of active wires, which improves design robustness to electromigration, thereby resulting in electromigration signoff for semiconductor structures/devices. A non-limiting example method includes determining a wire segment failing to meet an electromigration current limit on an integrated circuit (IC) and connecting fill shapes adjacent to the wire segment to cause the wire segment to meet the electromigration current limit, the fill shapes being non-functional shapes on the IC.

This can provide an improvement over known methods for addressing electromigration by efficiently leverage existing foundry fill metallization to facilitate thermal sink paths to reduce the temperature of sensitive wires.

In addition to one or more of the features described above or below, or as an alternative, in further embodiments of the invention the wire segment meets the electromigration current limit by having a temperature that achieves a temperature requirement associated with the electromigration current limit. One or more embodiments advantageously connects pre-existing fill shapes to meet the temperature requirement thereby increasing the electromigration current limit without requiring a wider wire segment.

In addition to one or more of the features described above or below, or as an alternative, in further embodiments of the invention the wire segment is determined to have a first temperature without connecting the fill shapes, the first temperature resulting in the wire failing to meet the electromigration current limit; and the wire segment is determined to have a second temperature responsive to connecting the fill shapes, the second temperature being lower than the first temperature and resulting in the wire meeting the electromigration current limit. One or more embodiments advantageously connects fill shapes to meet the electromigration current limit without requiring a wider wire segment.

In addition to one or more of the features described above or below, or as an alternative, in further embodiments of the invention connecting the fill shapes adjacent to the wire segment to cause the wire segment to meet the electromigration current limit comprises shorting the fill shapes adjacent to the wire segment to one or more other non-functional fill shapes, the one or more other non-functional fill shapes not being adjacent to the wire segment. One or more embodiments advantageously shorts fill shapes to meet the electromigration current limit without requiring a wider wire segment.

In addition to one or more of the features described above or below, or as an alternative, in further embodiments of the invention connecting the fill shapes adjacent to the wire segment to cause the wire segment to meet the electromigration current limit comprises shorting the fill shapes adjacent to the wire segment to other non-functional fill shapes, the other non-functional fill shapes not being adjacent to the wire segment, the other non-functional fill shapes being coupled to a region of the IC having a lower temperature than an active region of the IC at which the wire segment is located. One or more embodiments advantageously shorts fill shapes to meet the electromigration current limit by connecting to a thermal heat sink without requiring a wider wire segment.

In addition to one or more of the features described above or below, or as an alternative, in further embodiments of the invention connecting the fill shapes adjacent to the wire segment to cause the wire segment to meet the electromigration current limit comprises shorting the fill shapes adjacent to the wire segment and forming a via to connect the fill shapes having been shorted to another region of the IC. One or more embodiments advantageously shorts fill shapes to meet the electromigration current limit by connecting to a thermal heat sink without requiring a wider wire segment.

In addition to one or more of the features described above or below, or as an alternative, in further embodiments of the invention connecting the fill shapes adjacent to the wire segment to cause the wire segment to meet the electromigration current limit comprises shorting the fill shapes adjacent to the wire segment and forming a via to connect the fill shapes having been shorted to at least one other non-functional fill shape, the at least one other non-functional fill shape being at level of the IC different from the fill shapes having been shorted. One or more embodiments advantageously shorts fill shapes to meet the electromigration current limit by connecting to a thermal heat sink on any level of the IC without requiring a wider wire segment.

Embodiments of the present invention are directed to a method which includes providing a wire segment coupled to at least one active device on an IC and connecting fill shapes adjacent to the wire segment to cause the wire segment to meet an electromigration current limit, the fill shapes being non-functional shapes on the IC.

This can provide an improvement over known methods for addressing electromigration by efficiently leveraging existing foundry fill metallization to facilitate thermal sink paths to reduce the temperature of sensitive wires.

Other embodiments of the present invention implement features of the above-described methods in structures/devices.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4A depicts a block diagram of a top view of an example layout of a portion of an IC prior to any metal fill procedure according to one or more embodiments of the present invention;

FIG. 5A depicts a block diagram of a cross-sectional view of an IC prior to any metal fill procedure according to one or more embodiments of the present invention;

FIG. 5B depicts a block diagram of a cross-sectional view of an IC prior to selectively shorting fill metals/shapes according to one or more embodiments of the present invention;

FIG. 5C depicts a block diagram of a cross-sectional view of the IC subsequent to selectively shorting fill metals/shapes according to one or more embodiments of the present invention;

FIG. 6 is a flowchart of a method using adaptive fill techniques to avoid electromigration in wires of an IC, thereby resulting in electromigration signoff of the IC according to one or more embodiments of the present invention;

DETAILED DESCRIPTION

Figure 1:
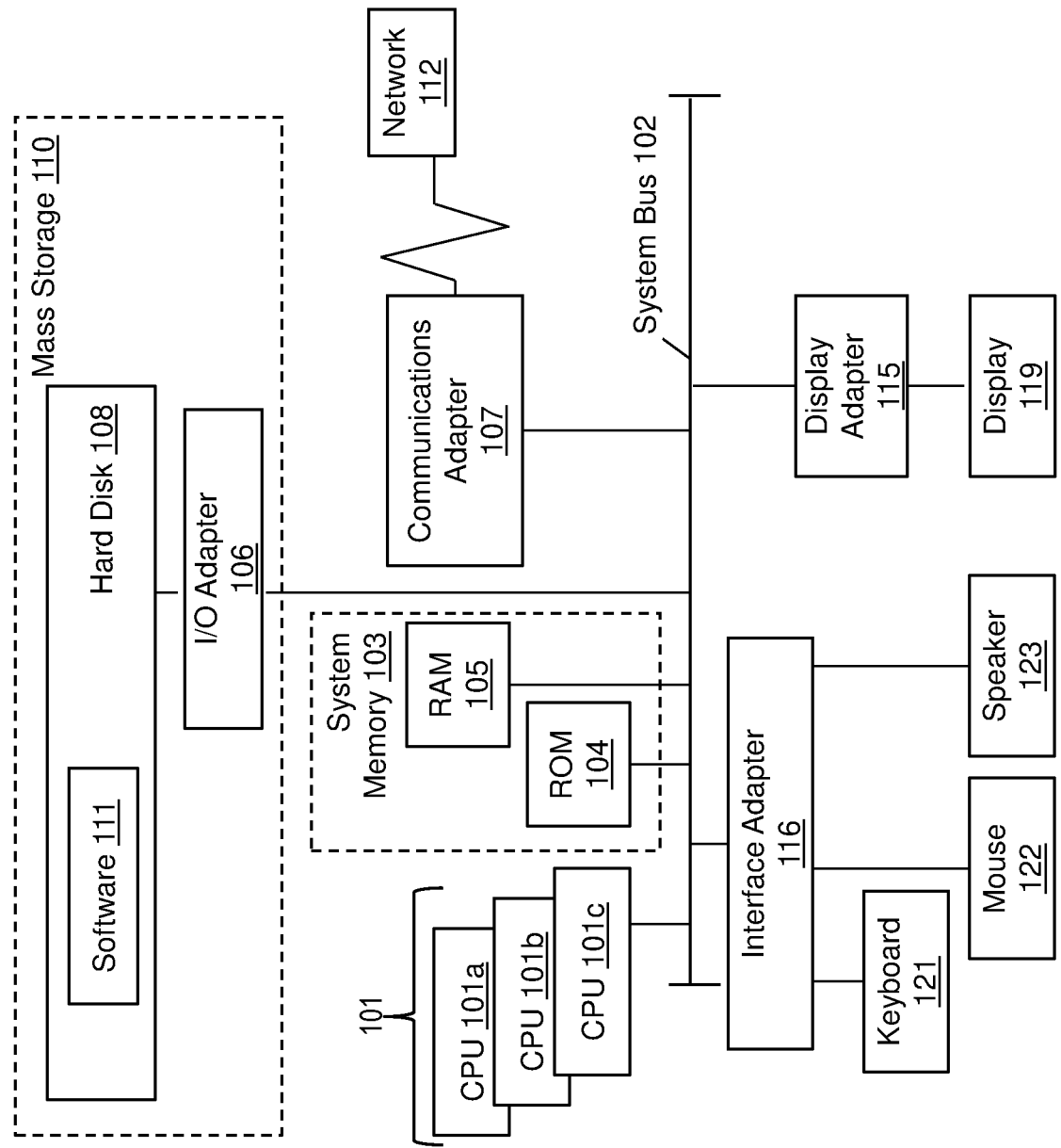
FIG. 1 depicts a block diagram of an example computer system for use in conjunction with one or more embodiments of the present invention.

One or more embodiments of the invention are configured to utilize the pervasive nature of the fill shapes to aid in electromigration signoff. Because real estate on ICs is limited, one or more embodiments of the invention are configured to leverage existing foundry fill metallization to facilitate thermal sink paths to reduce the temperature of sensitive wires. Foundry fill defines additional shapes (on metal or other layers) added to a design to improve manufacturing and reliability. Pertaining to one or more embodiments of the invention, these metal shapes are not associated with any circuit function and are not connected (i.e., the metal fill shapes are floating) to active wires or active devices. Fill shapes on metal layers have a low thermal resistance and can be used to adjust thermal gradients, according to one or more embodiments. According to one or more embodiments of the invention, an implementation includes selectively connecting metal fill shapes to realize a path to a cooler region on chip, where the selective connections are constrained by design rule checking (DRC) compliance and parasitic coupling concerns.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In the automated design of integrated circuits, "signoff" (also written as signoff) checks is the collective name given to a series of verification steps that the design must pass before it can be taped out. This implies an iterative process involving incremental fixes across the board using one or more check types, and then retesting the design. These signoff checks will typically involve both front-end and back-end layers. After all signoff checks are successfully completed, the chip goes to fabrication. After listing out all the features in the specification, the verification engineer will write coverage for those features to identify bugs and send back the register transfer level (RTL) design to the designer. Bugs or defects can include issues like missing features (comparing the layout to the specification), errors in design (typographical and functional errors), etc. When the coverage reaches a maximum percentage, the verification team will sign it off. There are several categories of signoff checks, one of which is electromigration signoff. Electromigration lifetime checks are performed to ensure a minimum lifetime of operation at the intended clock frequency and circuit use conditions without the circuit succumbing to electromigration.

Electromigration current limits in metal wires and vias are severely reduced at elevated temperature. Significant design effort is spent driving electromigration signoff closure using tools that analyze designs before foundry and before design fill shapes are added. The following example is considered for a wire failing electromigration signoff. When a wire fails electromigration signoff, one remedy is to increase the electromigration current limit of the wire by increasing the width (W) of that wire, thereby permitting more current to flow through the wire without reaching the electromigration current limit and enabling electromigration signoff. At width $W_1$, the wire fails electromigration signoff, whereas at width $W_2$ the wire passes electromigration signoff, where width $W_2$ is greater than width $W_1$. In this example, the width adjustment is done before a mandatory metal fill procedure. During the metal fill procedure, metal fill shapes, which are small, isolated shapes, are added on each metallization layer to improve manufacturing robustness, e.g., reducing unwanted over-polishing during chemical mechanical polishing (CMP), reducing corner rounding, or reducing bridging of structures.

One or more embodiments of the invention are configured to use adaptive fill techniques to avoid electromigration, thereby resulting in electromigration signoff for semiconductor structures/devices. As technical benefits and technical solutions, existing metal fill shapes are now endued with increased functionality toward meeting electromigration signoff according to one or more embodiments. Further, thermal coupling to heat sinks help to reach electromigration signoff without adjusting circuit wire widths that possibly detract from performance objectives. Moreover, strategic connections (i.e., shorting) of metal fill shapes are utilized to provide enhanced thermal conduction to the most convenient heat-sink structure on the substrate and/or another metal layer. Instead of increasing the wire width $W_1$ of the wire failing the electromigration current limit, the associated electromigration of the wire is lowered through temperature reduction by leveraging shorted metal fill shapes to provide a thermal path to a heat sink, according to one or more embodiments of the invention. The shorting methodology can be constrained based on the heat sink location in order to avoid design rule checking violations and/or to avoid excess parasitic capacitance.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
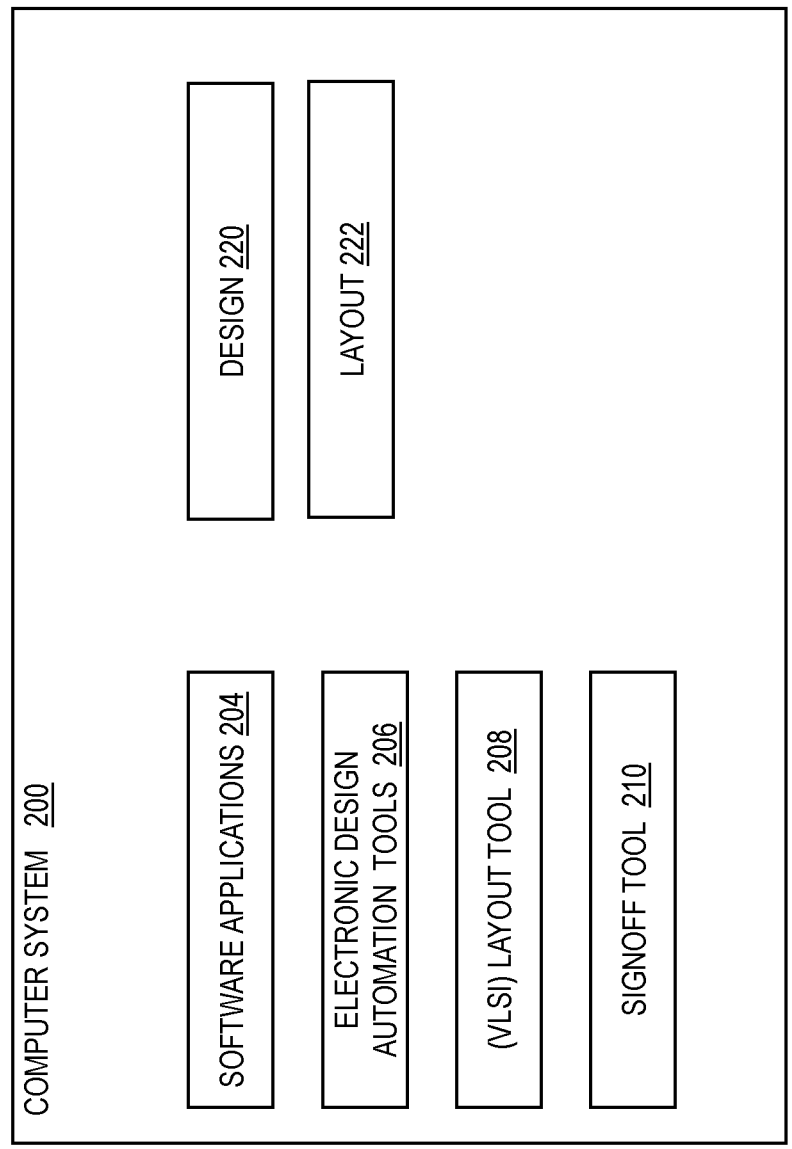
FIG. 2 is a block diagram of a computer system using adaptive fill techniques to avoid electromigration, thereby resulting in electromigration signoff and fabrication of a semiconductor structure for an IC according to one or more embodiments of the present invention.

FIG. 2 is a block diagram of a computer system 200 using adaptive fill techniques to avoid electromigration, thereby resulting in electromigration signoff and fabrication of a semiconductor structure for an IC according to one or more embodiments of the invention. Elements of computer system 100 may be used in and/or integrated into computers system 200. Software applications 204 may be implemented as software 111 executed on one or more processors 101, as discussed in FIG. 1. Software applications 204 may include, be coupled to, call, and/or be representative of an electronic design automation tool 206, a layout tool 208 (such as a very large-scale integration (VLSI) IC tool), signoff tool 210, etc., for generating, providing, and/or modifying one or more designs 220 and layouts 222 for an IC, as well signing off on the design 220 and/or layout 222.

Figure 3:
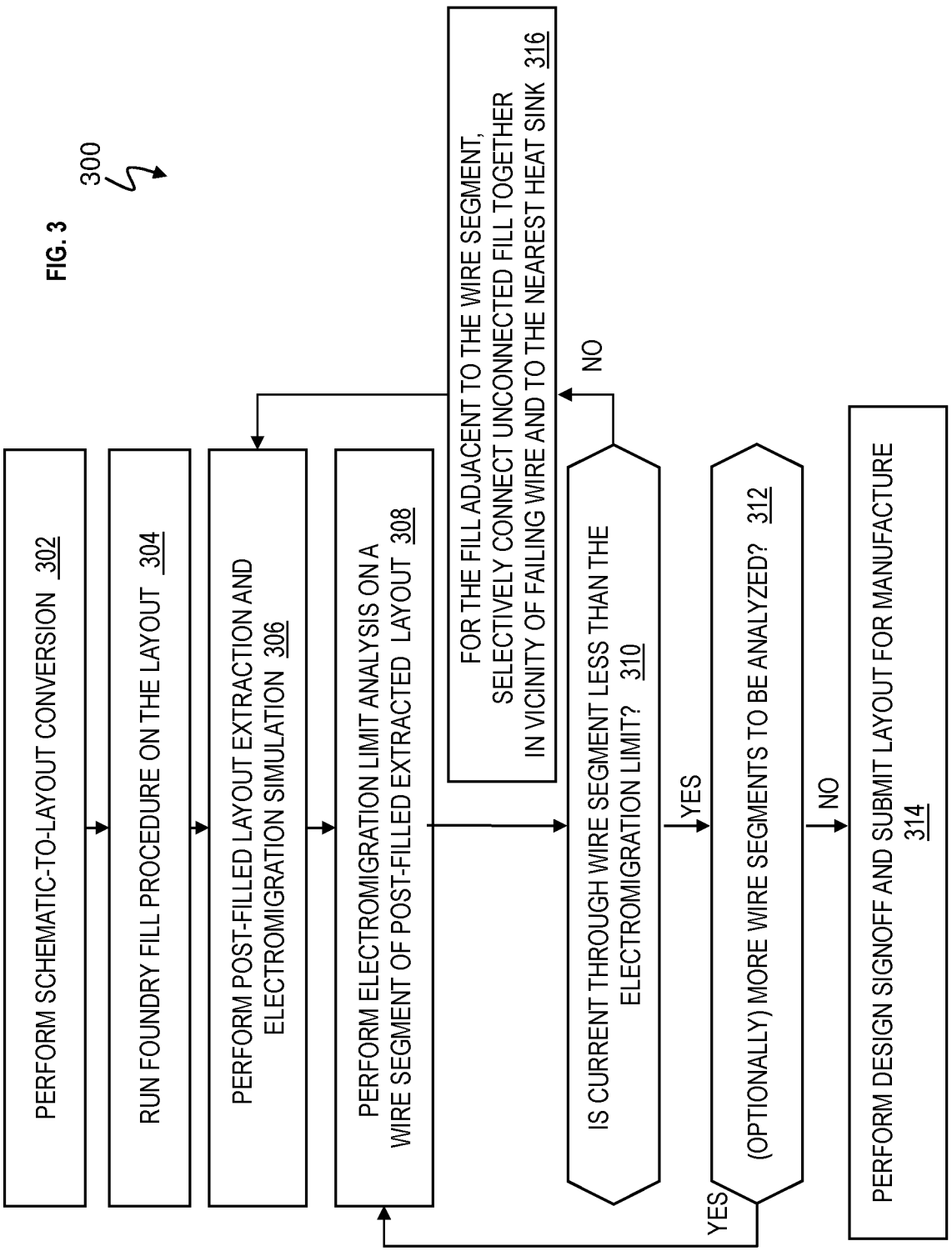
FIG. 3 is a flowchart of a process using adaptive fill techniques to avoid electromigration, thereby resulting in electromigration signoff and fabrication of a semiconductor structure for an IC according to one or more embodiments of the present invention.

FIG. 3 is a flowchart of a process 300 using adaptive fill techniques to avoid electromigration, thereby resulting in electromigration signoff and fabrication of a semiconductor structure for an IC according to one or more embodiments of the invention. One or more electronic automation design tools 206 can be utilized to perform circuit design and schematic-based netlist simulation of design 220 for the IC.

At block 302, after receiving and/or generating the design 220 for the IC, software application 204 is configured to perform, instruct, and/or call (VLSI) layout tool 208 to perform schematic-to layout conversion of design 220 resulting in layout 222. For example, FIG. 4A depicts a block diagram of a top view of an example layout of a portion of an IC 400 prior to any metal fill procedure. FIG. 4A illustrates only the active metal, which carries electrical current to and from active devices. It should be appreciated that there can be multiple metallization layers below and/or above the layer of IC 400 depicted in FIG. 4A.

Figure 4B:
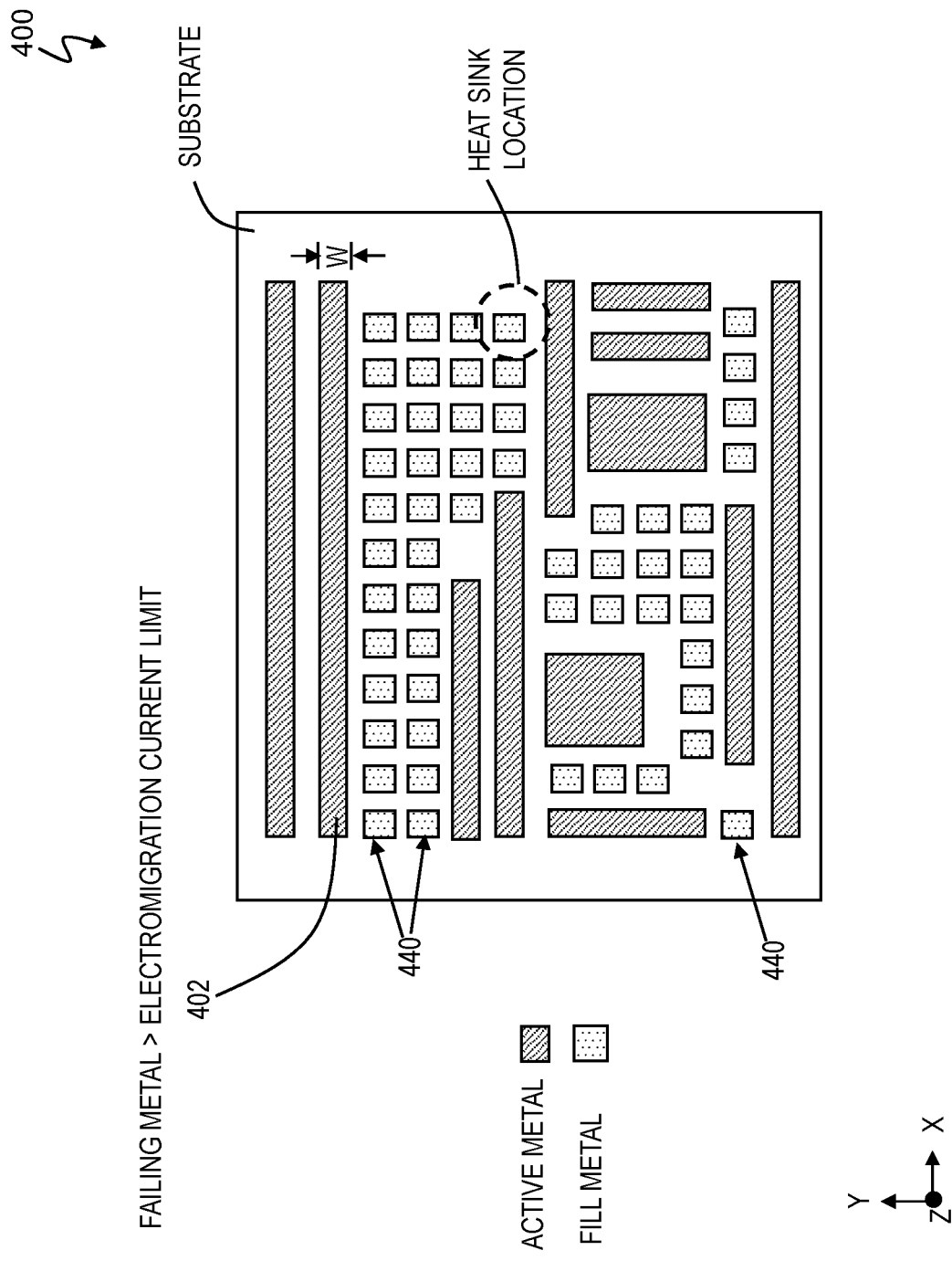
FIG. 4B depicts a block diagram of a top view of the example layout of a portion of the IC after the metal fill procedure according to one or more embodiments of the present invention.

At block 304, software application 204 is configured to run a foundry fill procedure and/or cause the foundry fill procedure to be run on layout 222. Software application 204 can include, be coupled to, and/or employ (e.g., call on) any metal fill procedure as understood by one of ordinary skill in the art. The use of metal fill shapes (sometimes called fill metal, metal fill, etc.) is a traditional and standard part of the IC design flow. Initially, metal fill shapes were used to improve planarity. Metal fill involves adding shapes or polygons to the design that are structural, not logical (i.e., not active). Metal fill gives a more even distribution of metal across the die by adding non-functional metal shapes to open regions in a design. These are non-functional shapes because they are not connected to active regions (i.e., transistors, logic circuits, etc.) of the IC to carry electrical current back and forth and are therefore not needed for the functionality of the active regions. Furthermore, the electrical circuits will still function normally without or without the non-functional shapes. This uniformity of metal density helps reduce thickness variations that occur during chemical-mechanical polishing (CMP). Metal is typically included pervasively through the design to improve design robustness and manufacturability. FIG. 4B depicts a block diagram of a top view of the example layout of a portion of the IC 400 after the metal fill procedure. As seen in FIG. 4B, metal fill shapes 440 are added in the open or unused areas of the substrate. Metal fill shapes 440 are illustrated with a dotted pattern. The fill metal is floating, which means that metal fill shapes 440 are not physically connected to any active devices and/or the active metal, such that electrical current is not carried by metal fill shapes 440.

At block 306, software application 204 is configured to perform and/or cause one or more electronic automation design tools 206 to perform layout extraction and simulation for layout 222 that has now been filled with fill metal. Simulation is performed which includes performing simulation on one or more wire segments of layout 222, such as wire segment 402.

At block 308, software application 204 is configured to perform electromigration current limit analysis and/or cause electromigration current limit analysis to be performed on the post-filled layout 222. Software application 204 can include, be coupled to, and/or employ (e.g., call on) a signoff tool 210 that is configured to analyze the layout 222 for electromigration current limits (i.e., constraints and violations), determine whether electromigration current limits are met, and sign off on electromigration when electromigration current limits are met. Software application 204 can employ any IC signoff tool as understood by one of ordinary skill in the art.

At block 310, software application 204 is configured to check if the electrical (steady state) current "I" (i.e., direct current (DC)) through a given wire segment is less that the electromigration current limit (also referred to as the DC limit (IDC LIMIT)) based on the electromigration current limit analysis previously performed. The temperature of the given wire segment is a function of the size of the wire, the amount of electrical current (IDC) flowing through the wire, the wire layer in the metal stack, and the temperature of the active silicon area. As the temperature of the wire rises, this reduces the electromigration current limit of the wire. When the electromigration current limit analysis determines that the IDC of the given wire segment is greater than the electromigration current limit ($IDC_{LIMIT}$), the given wire is considered a failing metal/wire (or victim metal/wire). As seen in FIGS. 4A and 4B, wire segment 402 is denoted as the failing metal/wire because wire segment 402 has a steady state current (IDC) greater than the $IDC_{LIMIT}$. Typically, the width W of wire segment 402 is increased to a wider width to support the electrical current (IDC) by increasing electromigration current limit $IDC_{LIMIT}$. However, one or more embodiments are configured increase the electromigration current limit $IDC_{LIMIT}$ of the wire temperature without requiring the width W of the wire segment to be increased but instead by reducing the wire temperature through shorting metal fill shapes as discussed herein.

If (Yes) the given wire segment is less than the electromigration current limit, software application 204 is configured to check if there are any more wire segments at block 312. If there are no more wire segments, software application 204 and/or signoff tool 210 is configured to sign off on layout 222 and submit layout 222 for manufacture at block 314. If there are more wire segments that need to be checked for electromigration limit analysis, flow proceeds to block 308.

Figure 4C:
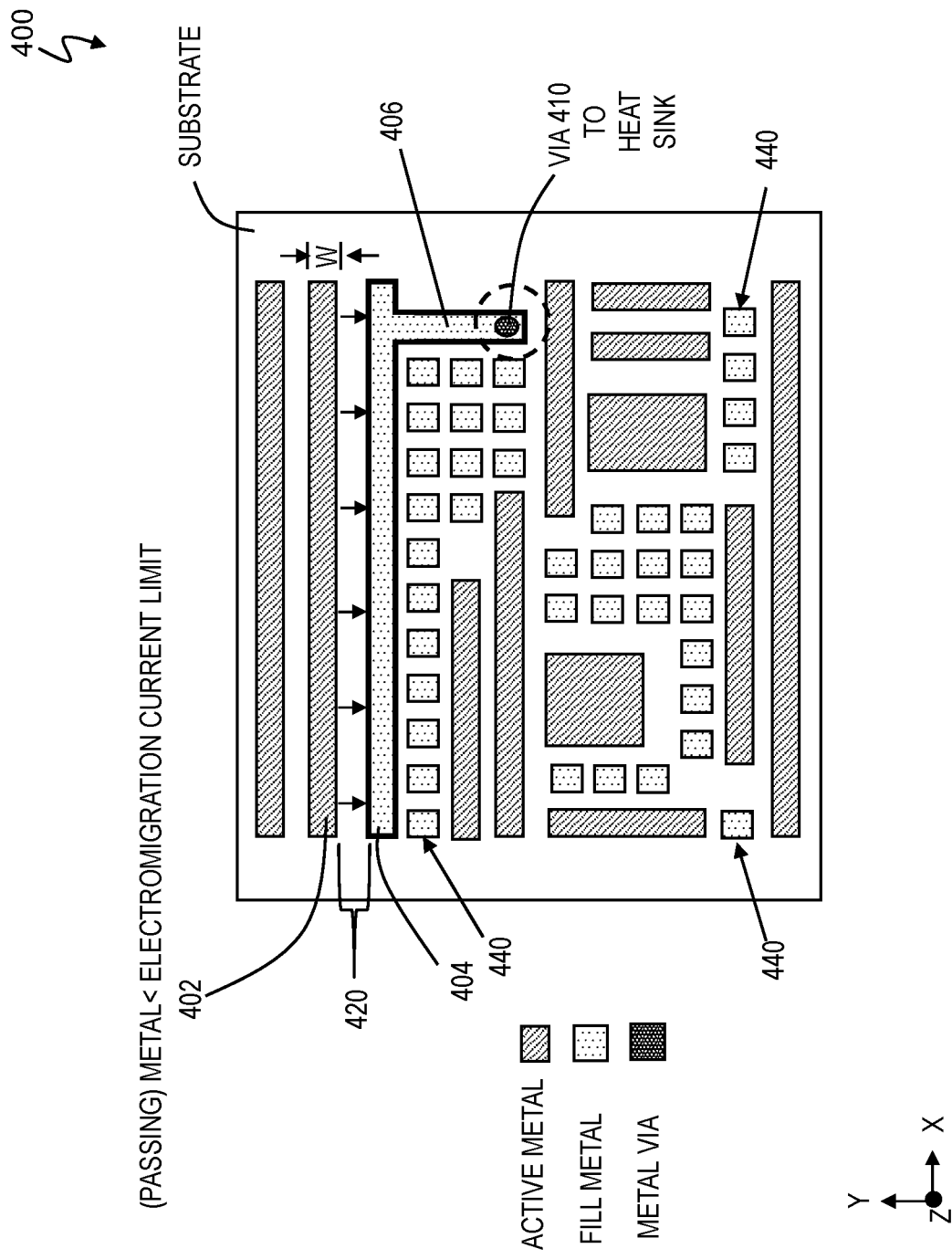
FIG. 4C depicts a block diagram of a top view of the example layout of the portion of the IC after connecting/shorting fill metal to reduce the temperature of the failing metal such that wire segment passes the electromigration current limit check according to one or more embodiments of the present invention.

At block 316, if (No) the electrical current for the given wire segment is more than the electromigration limit, software application 204 is configured to, for the metal fill shapes adjacent to the wire segment, connect all unconnected metal fill together to reach the nearest heat sink. In particular, software application 204 is configured to selectively connect unconnected metal fill shapes together in the vicinity of the failing wire segment 402 (metal/wire) as depicted in FIG. 4C. FIG. 4C depicts a block diagram of a top view of the example layout of the portion of the IC after connecting metal fill shapes to reduce the temperature of the failing metal such that wire segment 402 is now passing (i.e., less than) the electromigration limit. In FIG. 4C, a row of metal fill shapes in the X axis has been connected to form extended metal fill 404, and a column of fill metal in the Y axis has been connected to form extended metal fill 406, such that extended metal fills 404 and 406 are physically connected. Each extended metal fills can connect two or more metal fill shapes together. A metal is used to short/connect two or more metal fill shapes 440 together resulting in an extended metal fill. The extended metal fill can be extended in the X axis, the Y axis, and/or both the X and Y axes. Additionally, in the example, a heat sink is on another layer which could be above and/or below the layer depicted in the top view in FIG. 4C. A metal via 410 is formed through or from extended metal fill 406 to physically connect to the heat sink below or above. Metal via 410 can extend through a low-k dielectric material, an insulator material, etc. Arrows 420 represent the thermal cooling experienced by wire segment 402 coupled to extended metal fill 404. Further thermal cooling occurs because extended metal fill 404 is connected to extended metal fill 406, all of which results in the temperature of wire segment 402 being reduced. Although the steady state current (IDC) remains the same for wire segment 402, this reduction in temperature brings the wire segment 402 below the electromigration current limit ($IDC_{LIMIT}$) without increasing the width W. The electromigration current limit ($IDC_{LIMIT}$) is a function of the size (i.e., width) of a wire, the amount of electrical current flowing through the wire, and the total temperature of the ambient temperature in proximity to the wire and additional temperature because of the current.

FIGS. 5A, 5B, and 5C depict block diagrams of further examples of selectively shorting metal fill shapes according to one or more embodiments. FIGS. 5A, 5B, and 5C are cross-sectional views of a portion of an IC 500. FIG. 5A illustrates a cross-sectional view of one or more active devices 550 connected to active metal. Active device 550 can be representative of any logical circuits including transistors, etc., which generate heat. Active metal or active wires are illustrated with a diagonal pattern, and the active metal proceeds up from the active devices 550 so as to be connected for operation in the IC 500 as understood by one of ordinary skill in the art. Wire segment 502 is determined to be a failing wire/metal that does not pass the electromigration current limit analysis discussed above. Turning now to FIG. 5B, fill metal with the dotted pattern is in proximity to wire segment 502. FIG. 5B shows the various metal fill shapes 540 of the fill metal in a typical arrangement. Some metal fill shapes 540 are elongated in the X axis (along the plane of the figure) and some are elongated in the Y axis (out of the plane of the figure).

FIG. 5C illustrates a cross-sectional view of the IC 500 after selectively shorting the metal fill shapes 540 in proximity to the heat sinks. As a result, there is thermal coupling from the wire segment 502 and the extended metal fills. Metal fill shapes 540 are connected together on the same row in the X axis to form extended metal fills. The extended metal fills are connected to additional extended fill metals on different rows by metal vias, thereby connecting to one or more thermal heat sinks 552, 554. As can be seen in FIGS. 5B and 5C, the metal fill shapes 540 are formed on the same rows as active metals that carry electrical current. Each row is representative of a metal layer (metallization layer) in the IC, such as the M1 metal layer, M2 metal layer, M3 metal layer, and so forth. Metal vias are added to connect one extended metal fill to another extended metal fill above and/or below, as well as to connect an extended metal fill to a cooler part of the substrate such as thermal sink 552. The extended metal fills can connect to any cooler part of the IC which can act as a thermal sink.

As discussed herein, one or more embodiments are configured to leverage existing foundry fill metallization to facilitate thermal sink paths to reduce the temperature of sensitive wires. There can be a pre-filled layout that contains a (victim) wire segment that fails the electromigration current limit check because of an elevated temperature. The plan-of record (POR) fill shapes are applied. In accordance with one or more embodiments, fill shapes on the layers below, above, and adjacent to the wire segment in question can be shorted together to create a tightly coupled thermally conductive path. The (victim) wire segment temperature is reduced, thereby successfully passing the electromigration current limit check. As some of the technical benefits and solutions, existing fill shapes have increased functionality toward meeting electromigration signoff, and thermal coupling to heat sinks help to reach electromigration signoff without adjusting circuit wire widths. Accordingly, there is no modification of active metal which could affect placement and routing because the fill metal is originally placed in unused areas. Although illustrations have been provided to leverage existing foundry fill metallization to facilitate thermal sink paths to reduce the temperature of sensitive wires, it should be appreciated that in one or more embodiments of the invention the added thermal sinking shapes may be inserted prior to the foundry fill metallization, thereby reducing the temperature of the wire segment that failed the electromigration current limit check.

FIG. 6 is a flowchart of a method 600 using adaptive fill techniques to avoid electromigration in wires of an IC, thereby resulting in electromigration signoff of the IC according to one or more embodiments. At block 602, the method 600 includes determining a wire segment (e.g., wires segments 402, 502) failing to meet an electromigration current limit check on an IC (such as IC 400, 500). At block 604, the method 600 includes connecting fill shapes (e.g., metal fill shapes 440, 540) adjacent to the wire segment to cause the wire segment to meet the electromigration current limit check, the fill shapes (e.g., metal fill shapes 440, 540) being non-functional shapes on the IC.

The wire segment couples to at least one active device on the IC, as depicted in FIGS. 5B, 5C. Failing to meet the electromigration current limit check comprises the wire segment requiring an electrical current that fails to achieve a temperature requirement associated with the electromigration current limit check, as depicted in FIGS. 4A, 4B, 5A, 5B. The wire segment meets the electromigration current limit by having a temperature that achieves a temperature requirement associated with the electromigration limit, as depicted in FIGS. 4C, 5C.

The wire segment is determined to have a first temperature without connecting the fill shapes, the first temperature failing to meet the electromigration current limit, e.g., as depicted in FIGS. 4A, 4B, 5A, 5B); and the wire segment is determined to have a second temperature responsive to connecting the fill shapes, the second temperature being lower than the first temperature and meeting the electromigration current limit, e.g., as depicted in FIGS. 4C, 5C.

Connecting the fill shapes adjacent to the wire segment to cause the wire segment to meet the electromigration current limit comprises shorting the fill shapes adjacent to the wire segment to one or more other non-functional fill shapes, the one or more other non-functional fill shapes not being adjacent to the wire segment, e.g., as depicted in FIGS. 4C, 5C. Connecting the fill shapes adjacent to the wire segment to cause the wire segment to meet the electromigration current limit comprises shorting the fill shapes adjacent to the wire segment to other non-functional fill shapes, the other non-functional fill shapes not being adjacent to the wire segment, the other non-functional fill shapes being coupled to a region of the IC having a lower temperature than an active region of the IC at which the wire segment is located, e.g., as depicted in FIGS. 4C, 5C. Connecting the fill shapes adjacent to the wire segment to cause the wire segment to meet the electromigration current limit comprises shorting the fill shapes adjacent to the wire segment and forming a via to connect the fill shapes having been shorted to another region of the IC, e.g., as depicted in FIGS. 4C, 5C. Connecting the fill shapes adjacent to the wire segment to cause the wire segment to meet the electromigration current limit comprises shorting the fill shapes adjacent to the wire segment and forming a via to connect the fill shapes having been shorted to at least one other non-functional fill shape, the at least one other non-functional fill shape being at level of the IC different from the fill shapes having been shorted, e.g., as depicted in FIGS. 4C, 5C. The IC 400, 500 is a semiconductor structure comprising metallization layers, the fill shapes being formed on at least one of the one or more metallization layers.

Figure 7:
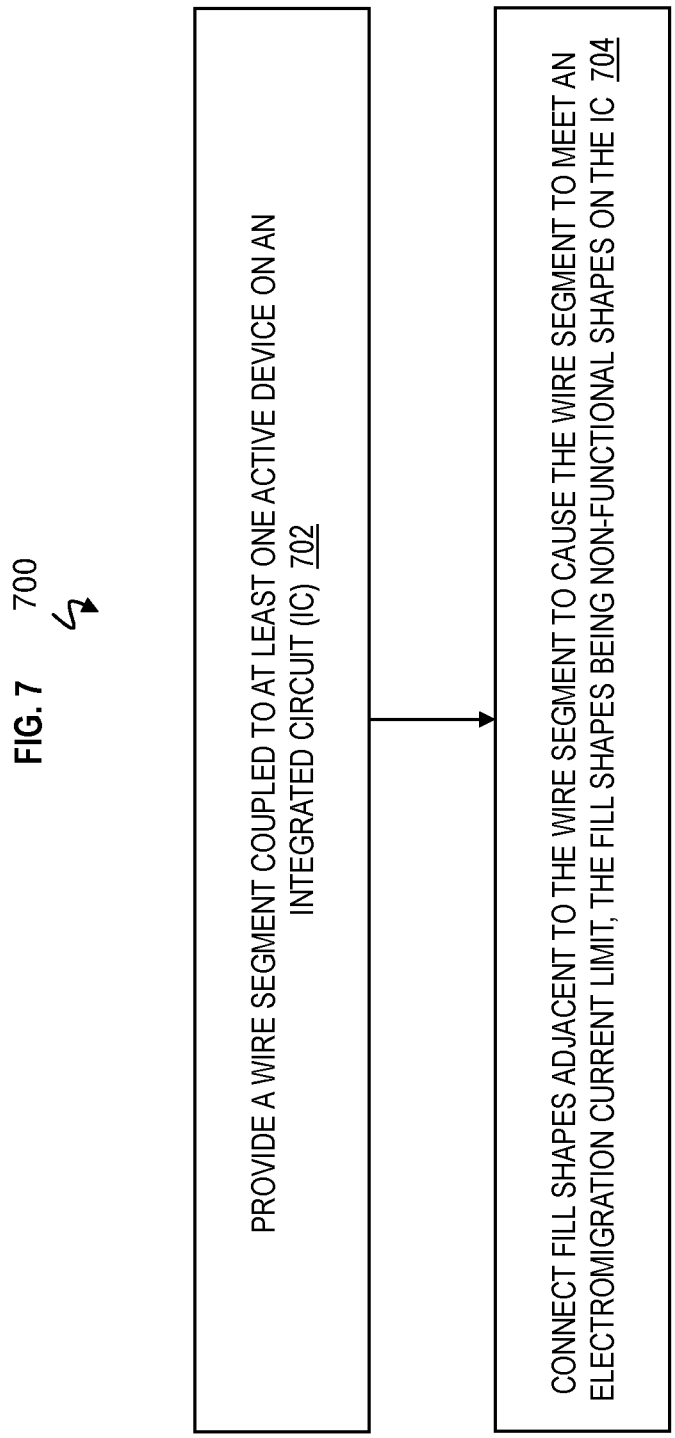
FIG. 7 is a flowchart of a method using adaptive fill techniques to avoid electromigration in wires of an IC, thereby resulting in electromigration signoff of the IC according to one or more embodiments of the present invention.

FIG. 7 is a flowchart of a method 700 using adaptive fill techniques to avoid electromigration in wires of an IC, thereby resulting in electromigration signoff of the IC according to one or more embodiments. At block 702, the method 700 includes providing a wire segment coupled to at least one active device on an IC (e.g., IC 400, 500). At block 704, the method 700 includes connecting fill shapes (e.g., fill metals 440, 540) adjacent to the wire segment to cause the wire segment to meet an electromigration current limit, the fill shapes (e.g., fill metals 440, 540) being non-functional shapes on the IC.

Figure 8:
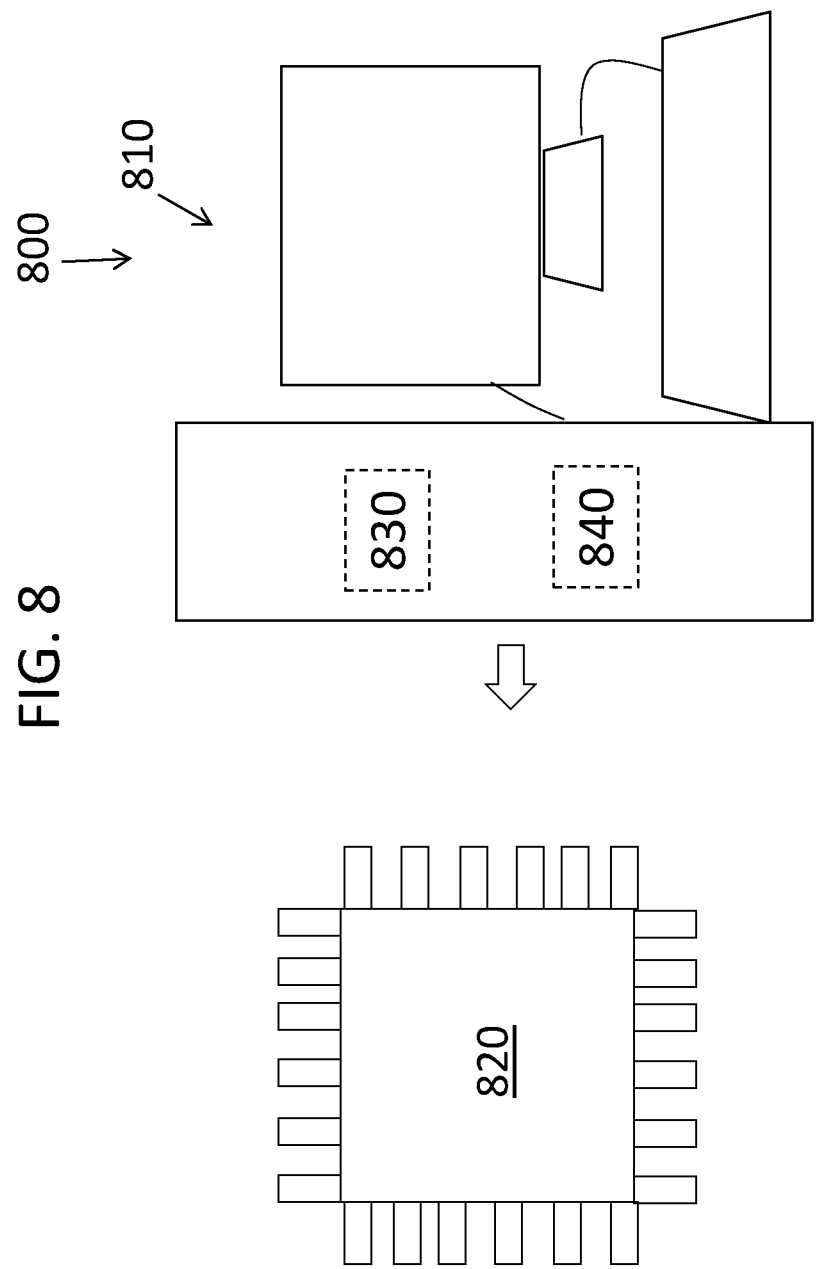
FIG. 8 is a block diagram of a system to design/layout a portion of an IC using adaptive fill techniques to avoid electromigration in accordance with one or more embodiments of the present invention.

FIG. 8 is a block diagram of a system 800 according to embodiments of the invention. The system 800 includes processing circuitry 810 used to generate the design 830 that is ultimately fabricated into an integrated circuit 820 (e.g., ICs 400, 500), which can include a variety of active semiconductor device. The steps involved in the fabrication of the integrated circuit 820 are well-known and briefly described herein. Once the physical layout 840 is finalized, based, in part, on ICs 400, 500 using adaptive fill techniques to avoid electromigration in wires of an IC, thereby resulting in electromigration signoff of the IC according to embodiments of the invention, the finalized physical layout 840 is provided to a foundry. Masks are generated for each layer of the integrated circuit based on the finalized physical layout. Then, the wafer is processed in the sequence of the mask order. The processing includes photolithography and etch. This is further discussed with reference to FIG. 9.

Figure 9:
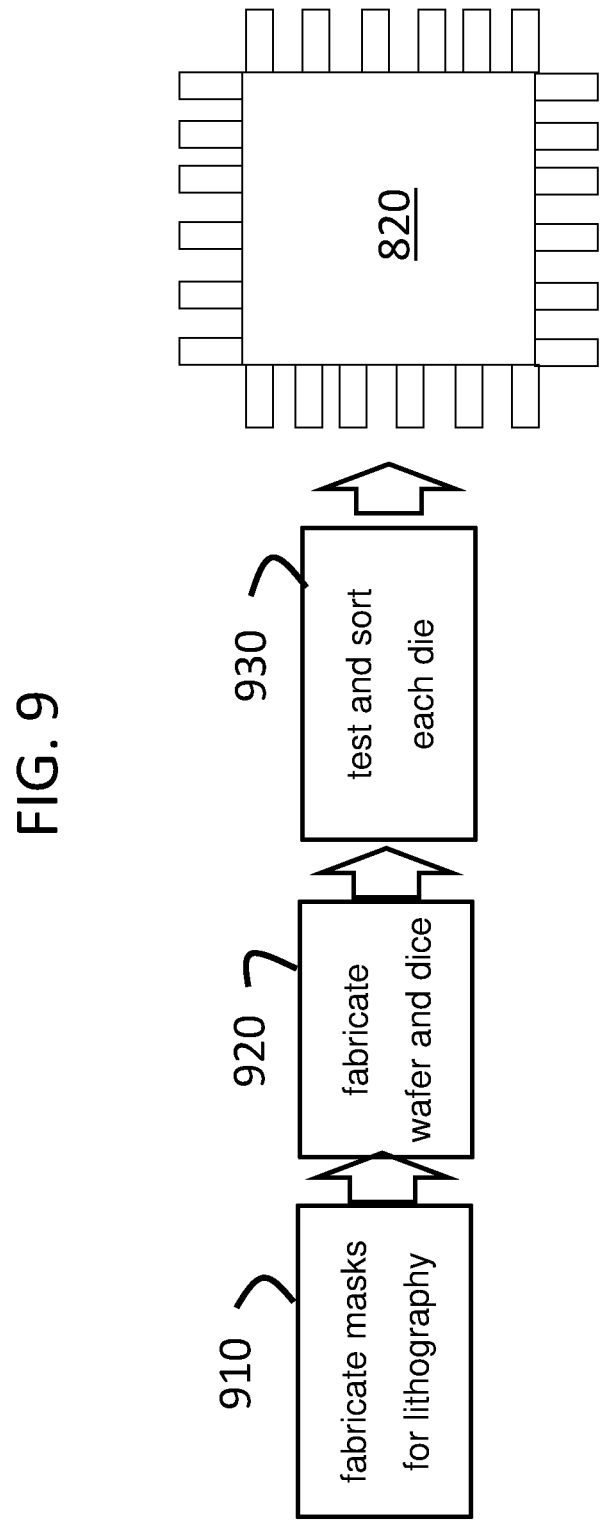
FIG. 9 is a process flow of a method of fabricating the IC of FIG. 8 in accordance with one or more embodiments of the present invention.

FIG. 9 is a process flow of a method of fabricating the integrated circuit according to exemplary embodiments of the invention. Once the physical design data is obtained, based, in part, ICs 400, 500 for vertical field effect transistors having different threshold voltages along the vertical channel, the integrated circuit 820 can be fabricated according to known processes that are generally described with reference to FIG. 9. Generally, a wafer with multiple copies of the final design is fabricated and cut (i.e., diced) such that each die is one copy of the integrated circuit 820. At block 910, the processes include fabricating masks for lithography based on the finalized physical layout. At block 920, fabricating the wafer includes using the masks to perform photolithography and etching. Once the wafer is diced, testing and sorting each die is performed, at block 930, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/ or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method comprising:
    determining a wire segment failing to meet an electromigration current limit on an integrated circuit (IC); and
    connecting fill shapes adjacent to the wire segment to cause the wire segment to meet the electromigration current limit, the fill shapes being non-functional shapes on the IC;
    wherein failing to meet the electromigration current limit comprises the wire segment requiring an electrical current that fails to achieve a temperature requirement associated with the electromigration current limit.

2. The method of claim 1, wherein the wire segment couples to at least one active device on the IC.

3. The method of claim 1, wherein the wire segment meets the electromigration current limit by having a temperature that achieves the temperature requirement associated with the electromigration current limit.

4. The method of claim 1, wherein:
    the wire segment is determined to have a first temperature without connecting the fill shapes, the first temperature failing to meet the electromigration current limit; and
    the wire segment is determined to have a second temperature responsive to connecting the fill shapes, the second temperature being lower than the first temperature and meeting the electromigration current limit.

5. The method of claim 1, wherein connecting the fill shapes adjacent to the wire segment to cause the wire segment to meet the electromigration current limit comprises shorting the fill shapes adjacent to the wire segment to one or more other non-functional fill shapes, the one or more other non-functional fill shapes not being adjacent to the wire segment.

6. The method of claim 1, wherein connecting the fill shapes adjacent to the wire segment to cause the wire segment to meet the electromigration current limit comprises shorting the fill shapes adjacent to the wire segment to other non-functional fill shapes, the other non-functional fill shapes not being adjacent to the wire segment, the other non-functional fill shapes being coupled to a region of the IC having a lower temperature than an active region of the IC at which the wire segment is located.

7. The method of claim 1, wherein connecting the fill shapes adjacent to the wire segment to cause the wire segment to meet the electromigration current limit comprises shorting the fill shapes adjacent to the wire segment and forming a via to connect the fill shapes having been shorted to another region of the IC.

8. The method of claim 1, wherein connecting the fill shapes adjacent to the wire segment to cause the wire segment to meet the electromigration current limit comprises shorting the fill shapes adjacent to the wire segment and forming a via to connect the fill shapes having been shorted to at least one other non-functional fill shape, the at least one other non-functional fill shape being at level of the IC different from the fill shapes having been shorted.

9. The method of claim 1, wherein the IC is a semiconductor structure comprising metallization layers, the fill shapes being formed on at least one of the metallization layers.

10. A method comprising:
    providing a wire segment coupled to at least one active device on an integrated circuit (IC); and
    connecting fill shapes adjacent to the wire segment to cause the wire segment to meet an electromigration current limit, the fill shapes being non-functional shapes on the IC;
    wherein the wire segment meets the electromigration current limit by having a temperature that achieves a temperature requirement associated with the electromigration current limit.

11. The method of claim 10, wherein the wire segment couples to the at least one active device on the IC.

12. The method of claim 10, wherein:
    the wire segment is determined to have a first temperature without connecting the fill shapes, the first temperature failing to meet the electromigration current limit; and
    the wire segment is determined to have a second temperature responsive to connecting the fill shapes, the second temperature being lower than the first temperature and meeting the electromigration current limit.

13. The method of claim 10, wherein connecting the fill shapes adjacent to the wire segment to cause the wire segment to meet the electromigration current limit comprises shorting the fill shapes adjacent to the wire segment to one or more other non-functional fill shapes, the one or more other non-functional fill shapes not being adjacent to the wire segment.

14. The method of claim 10, wherein connecting the fill shapes adjacent to the wire segment to cause the wire segment to meet the electromigration current limit comprises shorting the fill shapes adjacent to the wire segment to other non-functional fill shapes, the other non-functional fill shapes not being adjacent to the wire segment, the other non-functional fill shapes being coupled to a region of the IC having a lower temperature than an active region of the IC at which the wire segment is located.

15. The method of claim 10, wherein connecting the fill shapes adjacent to the wire segment to cause the wire segment to meet the electromigration current limit comprises shorting the fill shapes adjacent to the wire segment and forming a via to connect the fill shapes having been shorted to another region of the IC.

16. The method of claim 10, wherein connecting the fill shapes adjacent to the wire segment to cause the wire segment to meet the electromigration current limit comprises shorting the fill shapes adjacent to the wire segment and forming a via to connect the fill shapes having been shorted to at least one other non-functional fill shape, the at least one other non-functional fill shape being at level of the IC different from the fill shapes having been shorted.

* * * * *